(12) United States Patent
Huang

(10) Patent No.: US 6,376,778 B1
(45) Date of Patent: Apr. 23, 2002

(54) PRINTED CIRCUIT BOARD ASSEMBLY

(75) Inventor: Yao-Lun Huang, Taipei Hsien (TW)

(73) Assignee: Silitek Corporation, Taipei (TW)

( * ) Notice: Subject to any disclaimer, the term of this patent is extended or adjusted under 35 U.S.C. 154(b) by 0 days.

(21) Appl. No.: 09/824,820

(22) Filed: Apr. 4, 2001

(30) Foreign Application Priority Data

Dec. 20, 2000 (TW) ..................................... 89222129 U

(51) Int. Cl.[7] .............................. H05K 1/00; H05K 1/16; H01R 12/16; H01R 12/24
(52) U.S. Cl. .................. 174/254; 361/786; 361/790; 361/791; 439/67; 439/493; 174/260; 174/261
(58) Field of Search ............................... 174/250, 254, 174/260; 361/784, 785, 786, 787, 788, 789, 790; 439/67, 493, 59, 61

(56) References Cited

U.S. PATENT DOCUMENTS

| | | | |
|---|---|---|---|
| 5,263,868 A | * | 11/1993 | Renn et al. .................... 439/67 |
| 6,017,244 A | * | 1/2000 | Daane ......................... 439/495 |
| 6,323,437 B1 | * | 11/2001 | Johnson ....................... 174/260 |

* cited by examiner

*Primary Examiner*—Kamand Cuneo
*Assistant Examiner*—Quynh-Nhu H. Vu
(74) *Attorney, Agent, or Firm*—Rosenberg, Klein & Lee

(57) ABSTRACT

A printed circuit board assembly comprises a circuit membrane, a printed circuit board, a cover plate and two screws. The cover plate has an arch-shaped bump formed thereon such that the ribbon cable has firm contact with the printed circuit board. Therefore, the electric contacts of the printed circuit board are in firm contact with the electric contacts of the circuit membrane. The cost and assembling time is saved.

9 Claims, 9 Drawing Sheets

US 6,376,778 B1

PRINTED CIRCUIT BOARD ASSEMBLY

FIELD OF THE INVENTION

The present invention relates to a printed circuit board assembly, especially to a printed circuit board assembly wherein the printed circuit board stably contacts with a circuit membrane and can be used for keyboards and scanners.

BACKGROUND OF THE INVENTION

As computer becomes more and more important and omnipresent to modern society, people rely on keyboard to key in various data for computer or cash register. Therefore, the keyboards are under extensive research and the requirement for keyboards are strict. For example, the appearance, tactility, click sound and balance of the keyboards are demanding factors.

The conventional keyboard generally comprises a printed circuit board assembled with a circuit membrane. The circuit membrane is a silvery mesh film with extended ribbon cable connected to the rigid printed circuit board provides electrical connection between the printed circuit board and the circuit membrane.

FIG. 1 shows a prior art printed circuit board assembly composed of a printed circuit board 12a and a circuit membrane 10a. The circuit membrane 10a has an extended ribbon cable 11a electrically connected to the printed circuit board 12a. The prior art printed circuit board 12a is electrically connected to the ribbon cable 11a through a connection stage 13a. The connection stage 13a is arranged on the printed circuit board 12a and the ribbon cable 11a is inserted into the connection stage 13a such that the circuit membrane 10a is electrically connected to the printed circuit board 12a. The use of connection stage 13a can achieve stable connection. However, the cost of the connection stage 13a is high and the assembling thereof is time consuming.

FIGS. 2 and 3 show another prior art printed circuit board assembly for keyboard. The keyboard has a flexible pad 15a on the cover plate 14a thereof. The ribbon cable 11a of the circuit membrane is sandwiched between the flexible pad 15a and the printed circuit board 12a. Moreover, the printed circuit board 12a is fixed to the flexible pad 15a by screwing two screws 16a such that the ribbon cable 11a of the circuit membrane is clamped between the cover plate 14a and the printed circuit board 12a. The electric contacts of the printed circuit board 12a are in contact with the electric contacts of the ribbon cable 11a of the circuit membrane. However, the screws 16 are generally screwed at both lateral sides of the printed circuit board 12a, the stress exerted on the printed circuit board 12a is uneven. The center part of the printed circuit board 12a is protuberant and the electric contacts of the printed circuit board 12a have poor contact with the electric contacts of the ribbon cable 11a.

SUMMARY OF THE INVENTION

It is an object of the present invention to provide a printed circuit board assembly. After screws screw the both sides of the printed circuit board, the stress can be uniformly distributed. Therefore, the electric contacts of the printed circuit board are in firm contact with the electric contacts of the circuit membrane.

It is another object of the present invention to provide a printed circuit board assembly, which has simple structure and the cost and assembling time is saved.

To achieve the above object, the present invention provides a printed circuit board assembly comprises a circuit membrane, a printed circuit board, a cover plate and two screws.

The circuit membrane has an extended ribbon cable with a plurality of electric contacts. The printed circuit board has a plurality of electric contacts corresponding to the electric contacts of the circuit membrane. The cover plate has an arch-shaped bump formed thereon and the location thereof being corresponding to the electric contacts of the circuit membrane and the printed circuit board. The screws penetrate through both sides of the printed circuit board and are screwed to the cover plate, thus fixing the printed circuit board to the cover plate and clamping the ribbon cable between the cover plate and the printed circuit board. The electric contacts of the printed circuit board are in contact with the electric contacts of the circuit membrane.

The various objects and advantages of the present invention will be more readily understood from the following detailed description when read in conjunction with the appended drawing, in which:

DETAILED DESCRIPTION OF THE INVENTION

Figure 1:
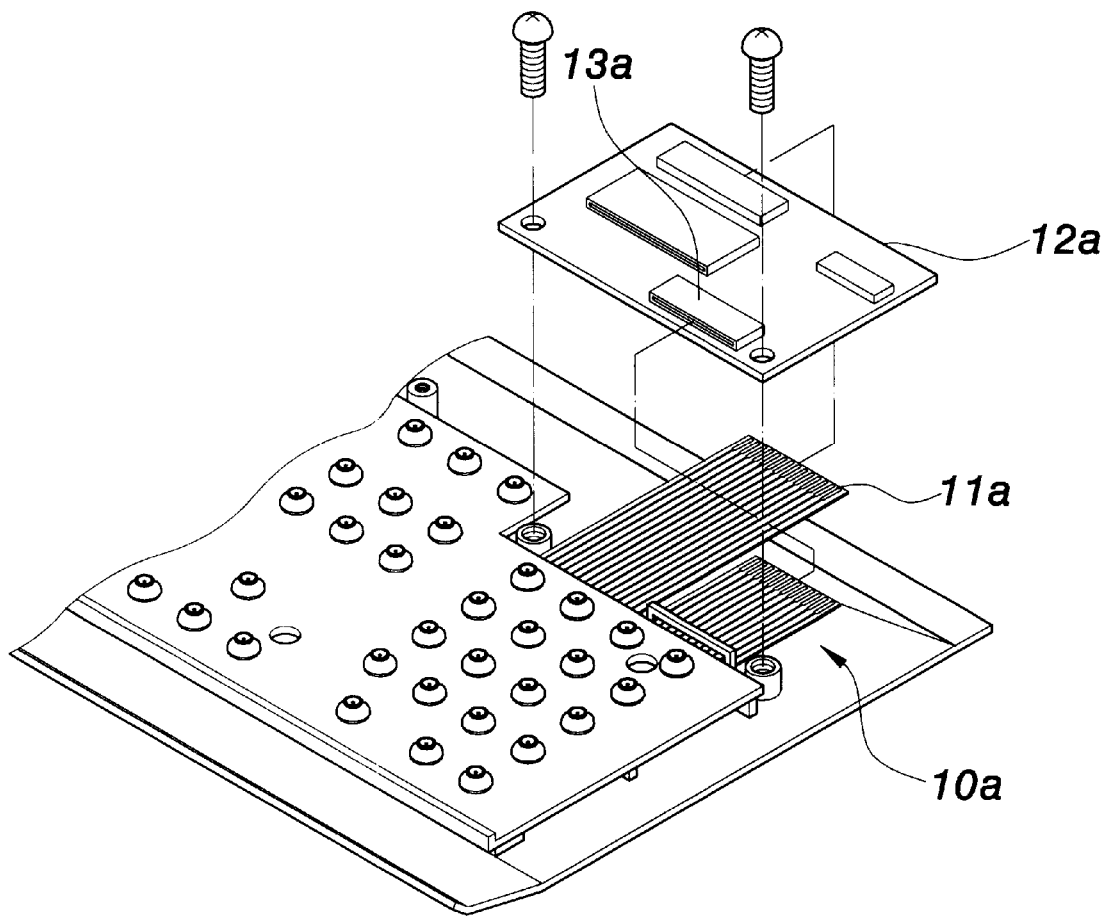
FIG. 1 shows a prior art printed circuit board assembly composed of a printed circuit board and a circuit membrane.
Figure 2:
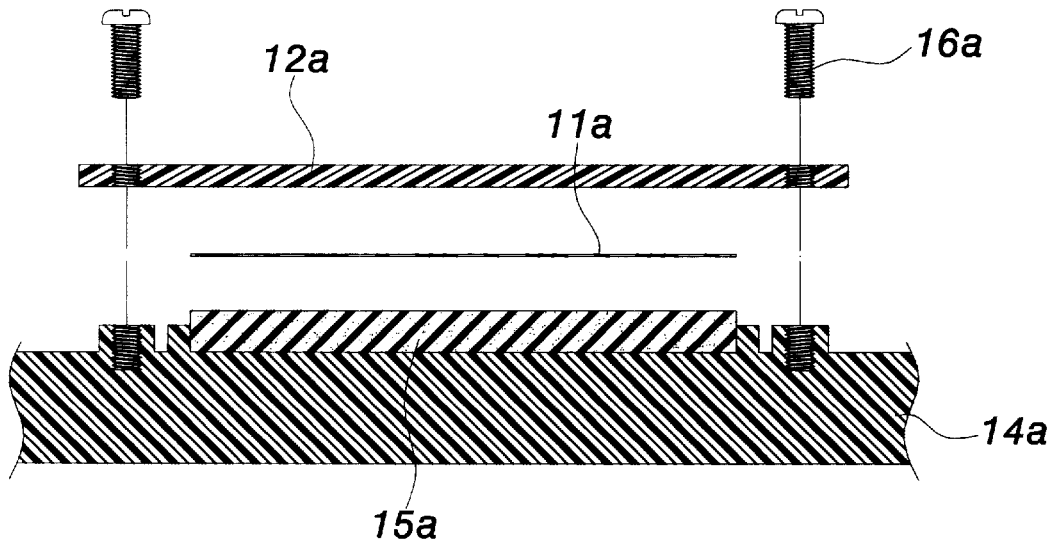
FIG. 2 shows another prior art printed circuit board assembly for keyboard and in exploded state.
Figure 3:
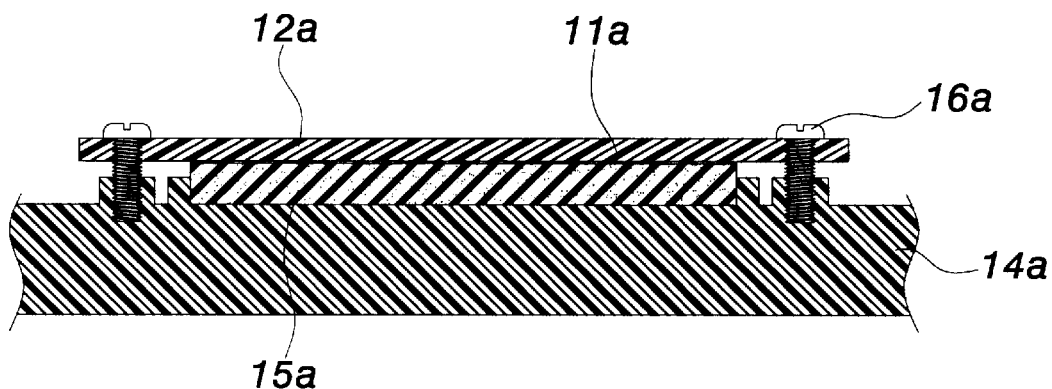
FIG. 3 shows another prior art printed circuit board assembly for keyboard and in assembled state.
Figure 4:
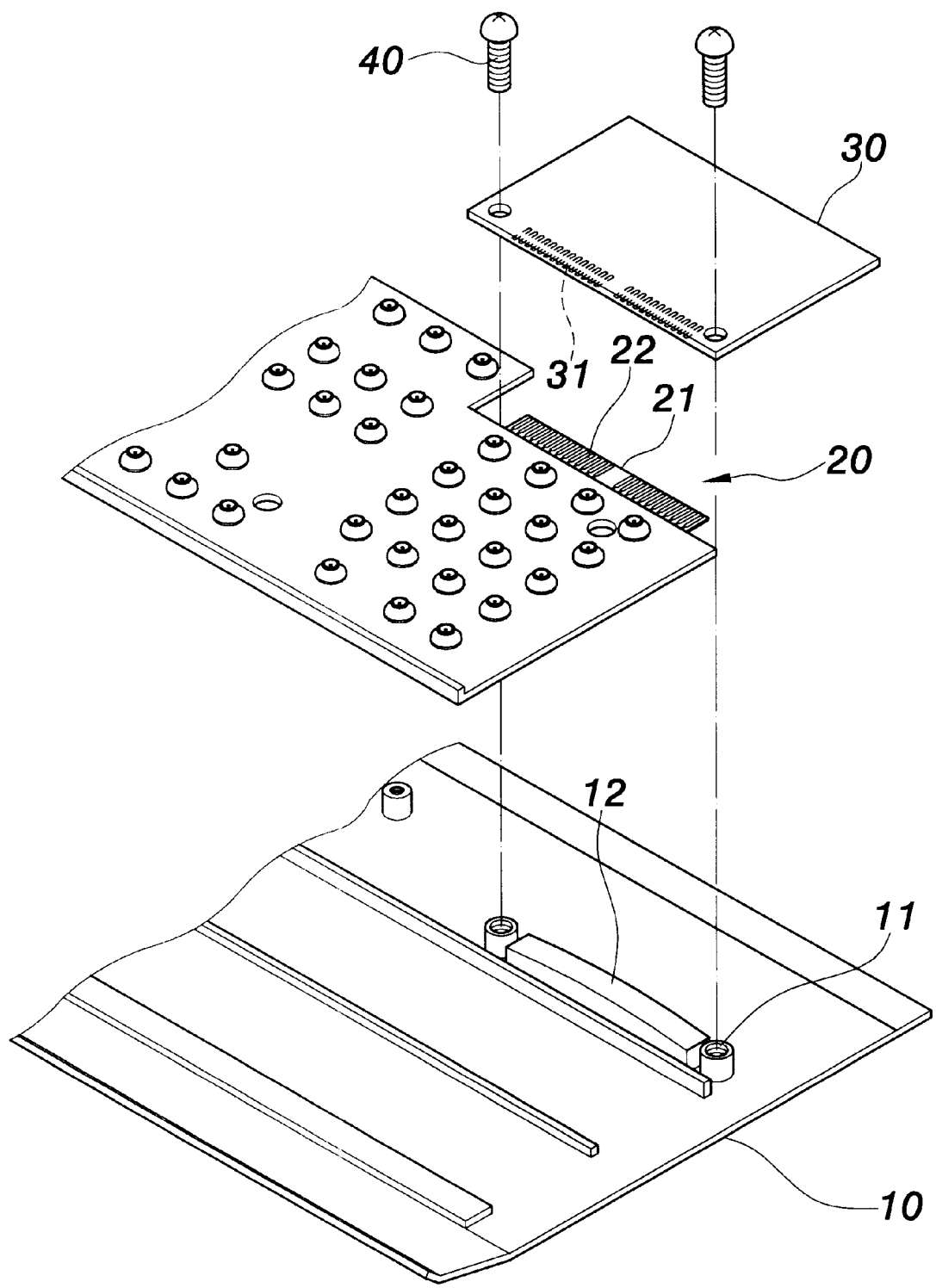
FIG. 4 shows the exploded view of the first preferred embodiment of the present invention.
Figure 5:
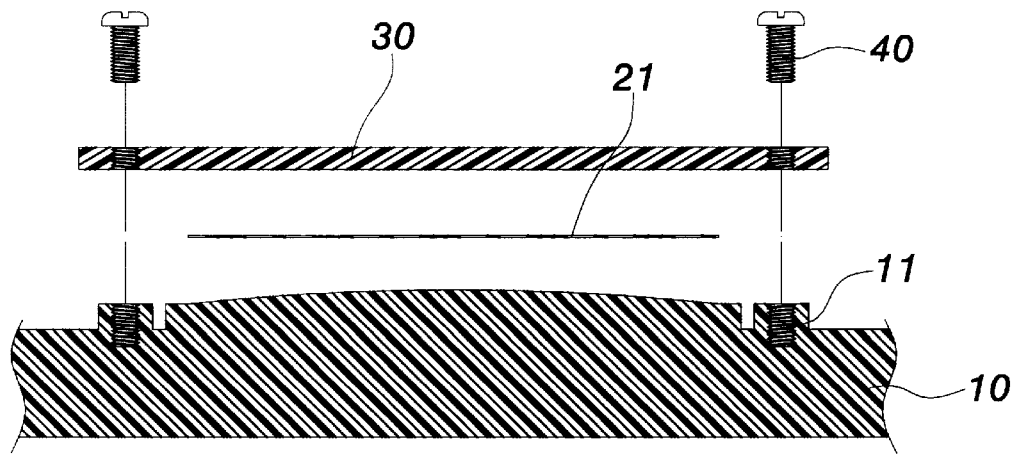
FIG. 5 shows the sectional view of the first preferred embodiment of the present invention in exploded state.

With reference to FIGS. 4 and 5, the printed circuit board assembly according to a preferred embodiment of the present invention is arranged on a keyboard and comprises a cover plate 10, a circuit membrane 20, a printed circuit board 30 and two screws 40. The cover plate 10 is part of the keyboard and can be a top cover plate or a bottom cover plate. The cover plate 10 comprises two threaded holes 11. The circuit membrane 20 is a silvery mesh film and arranged atop or on bottom of the cover plate 10. The circuit membrane 20 has extended ribbon cable 21 with electric contacts 22. The printed circuit board 30 is placed atop or below the circuit membrane 20 and is a rigid board with a plurality electric contacts 31 corresponding to the electric contacts 22 of the circuit membrane 20.

Figure 6:
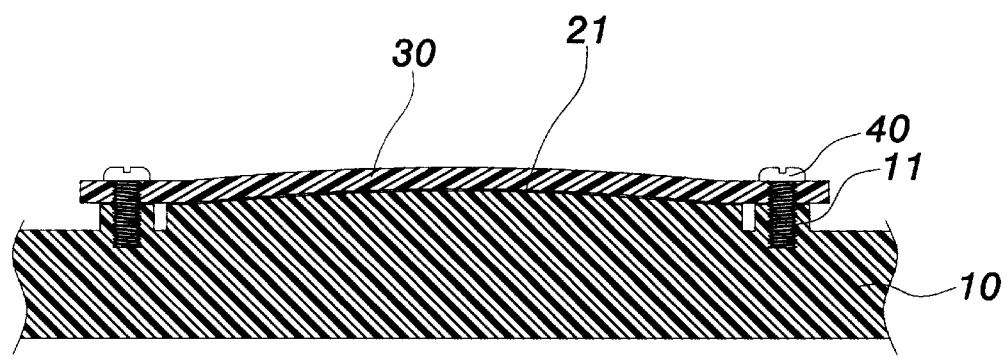
FIG. 6 shows the sectional view of the first preferred embodiment of the present invention in assembled state.

As shown in FIG. 6, the two screws 40 penetrate through both sides of the printed circuit board 30 and then are screwed to the two threaded holes 11 of the cover plate 10, whereby the printed circuit board 30 is fixed to the cover plate 10, and the ribbon cable 21 is clamped between the cover plate 10 and the printed circuit board 30. The electric contacts 31 of the printed circuit board 30 are in contact with the electric contacts 22 of the circuit membrane 20, as shown in FIG. 4.

The printed circuit board assembly according to the present invention is characterized in that an arch-shaped bump 12 is formed on the cover plate 10. When the two screws 40 are screwed to the two threaded holes 11 of the cover plate 10, the stress is uniformly distributed. Therefore, the ribbon cable 21 of the circuit membrane 20 has firm contact with the printed circuit board 30. The electric contacts 31 of the printed circuit board 30 are in firm contact with the electric contacts 22 of the circuit membrane 20 when the circuit membrane 20 is assembled on the printed circuit board 30.

The present invention provides a simple structure, i.e., an arch-shaped bump 12 formed on the cover plate 10. By this structure, the electric contacts 31 of the printed circuit board 30 are in firm contact with the electric contacts 22 of the circuit membrane 20.

Figure 7:
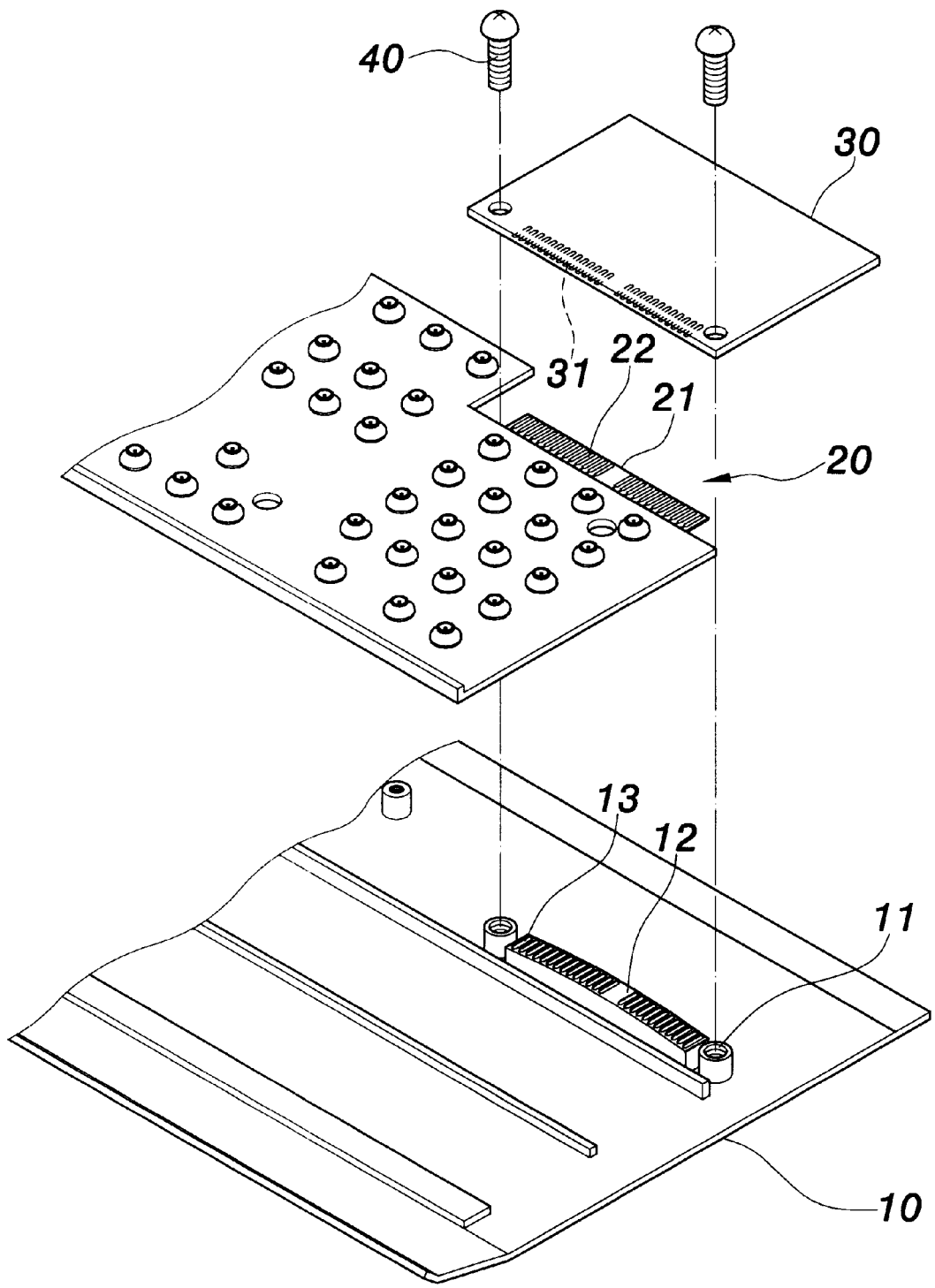
FIG. 7 shows the exploded view of the second preferred embodiment of the present invention.
Figure 8:
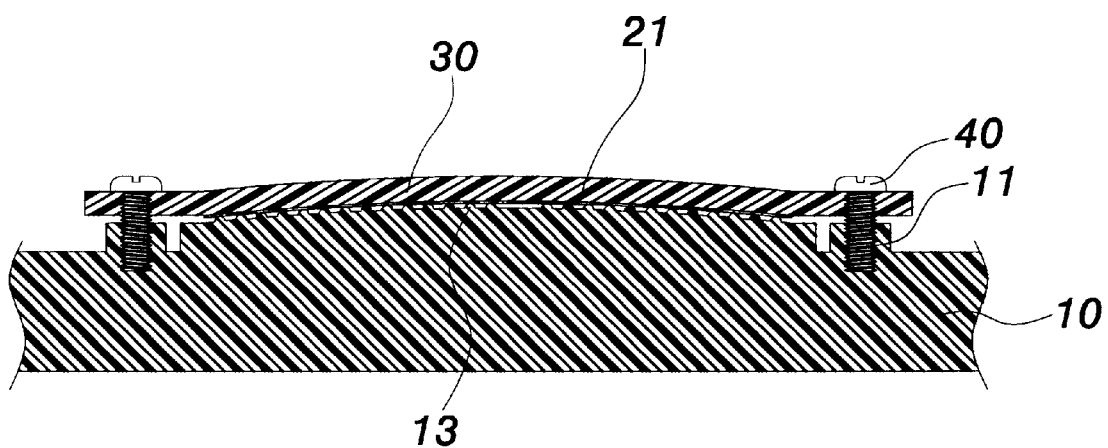
FIG. 8 shows the sectional view of the second preferred embodiment of the present invention in assembled state.

Moreover, as shown in FIGS. 7 and 8, in another preferred embodiment of the present invention, a plurality of ribs 13 are formed on the arch-shaped bump 12 of the cover plate 10. The ribs 13 are located at the positions corresponding to that of the electric contacts 31 of the printed circuit board 30 and the electric contacts 22 of the circuit membrane 20. The ribs 13 heaves the electric contacts 22 of the circuit membrane 20 such that the electric contacts 22 of the circuit membrane 20 approach toward the electric contacts 31 of the printed circuit board 30. Therefore, the electric contacts 31 of the printed circuit board 30 are in firm contact with the electric contacts 22 of the circuit membrane 20.

Figure 9:
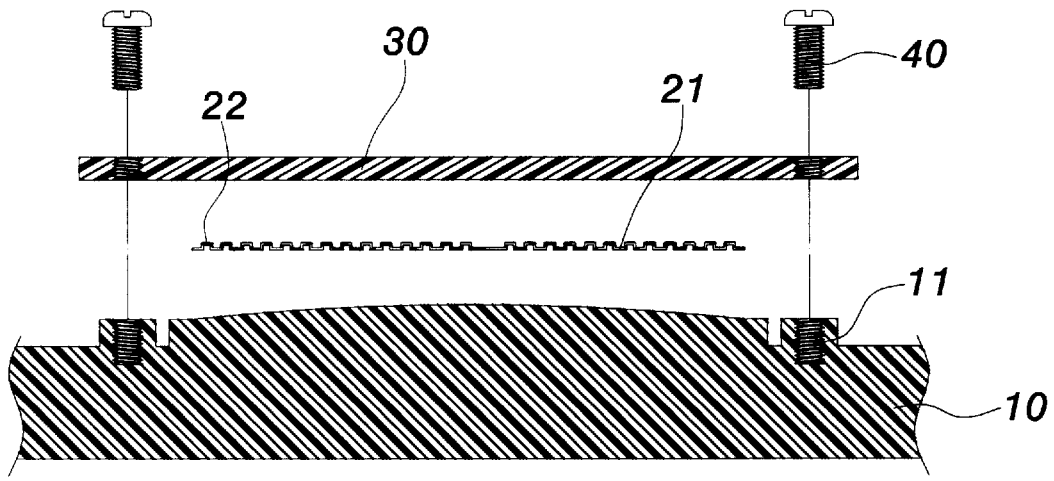
FIG. 9 shows the sectional view of the third preferred embodiment of the present invention in exploded state.
Figure 10:
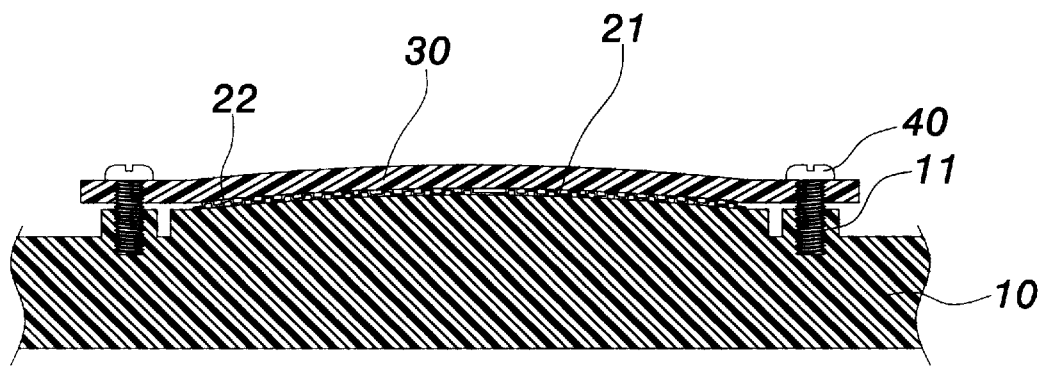
FIG. 10 shows the sectional view of the third preferred embodiment of the present invention in assembled state.

As shown in FIGS. 9 and 10, in still another preferred embodiment of the present invention, the ribbon cable 21 of the circuit membrane 20 is thermally pressed to form corrugated shape with convex portions and concave portions. The electric contacts 22 of the circuit membrane 20 are located at the convex portions such that the electric contacts 22 of the circuit membrane 20 approaches toward the electric contacts 31 of the printed circuit board 30. Therefore, the electric contacts 31 of the printed circuit board 30 are in firm contact with the electric contacts 22 of the circuit membrane 20.

Figure 11:
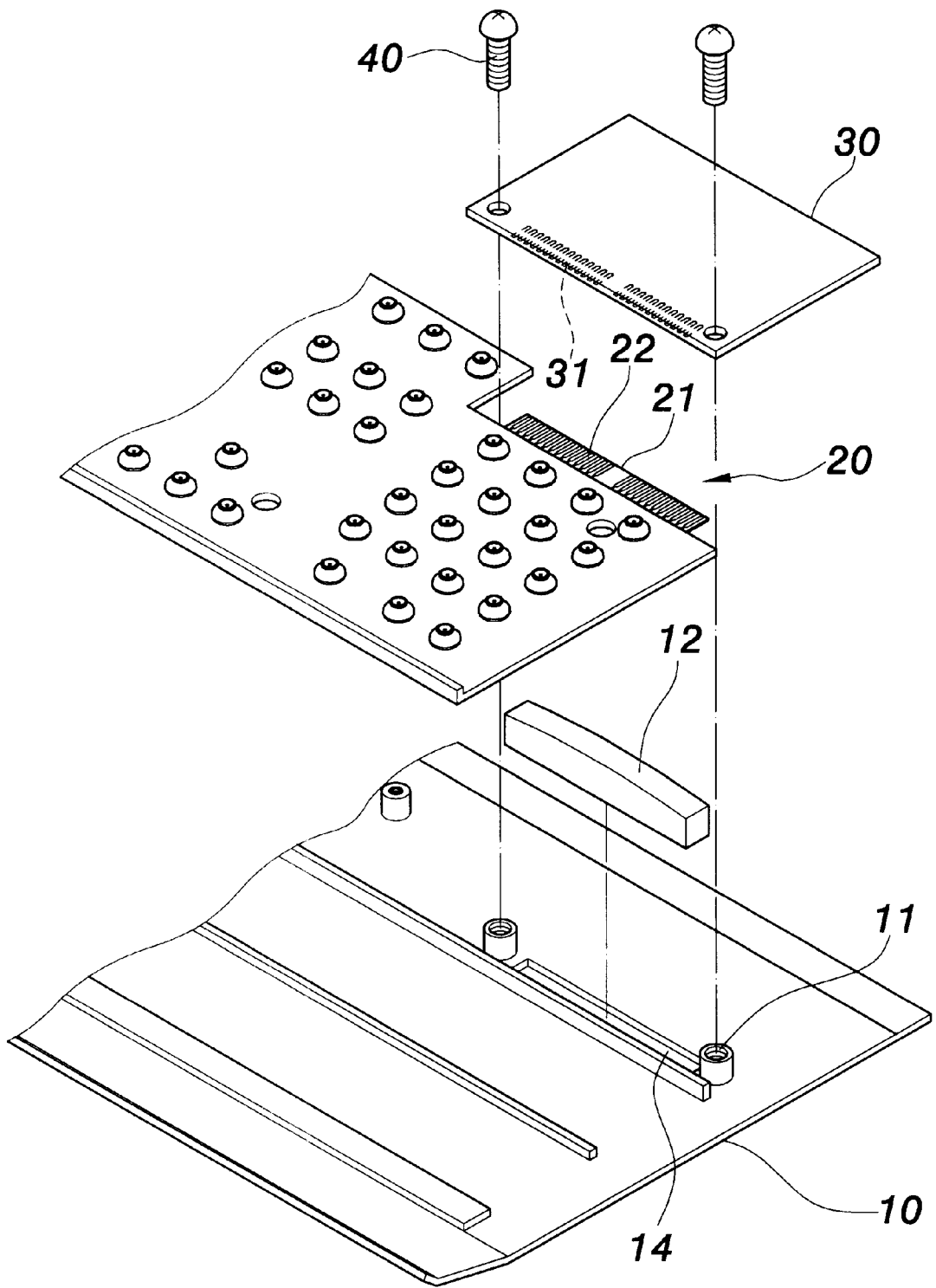
FIG. 11 shows the exploded view of the fourth preferred embodiment of the present invention.
Figure 12:
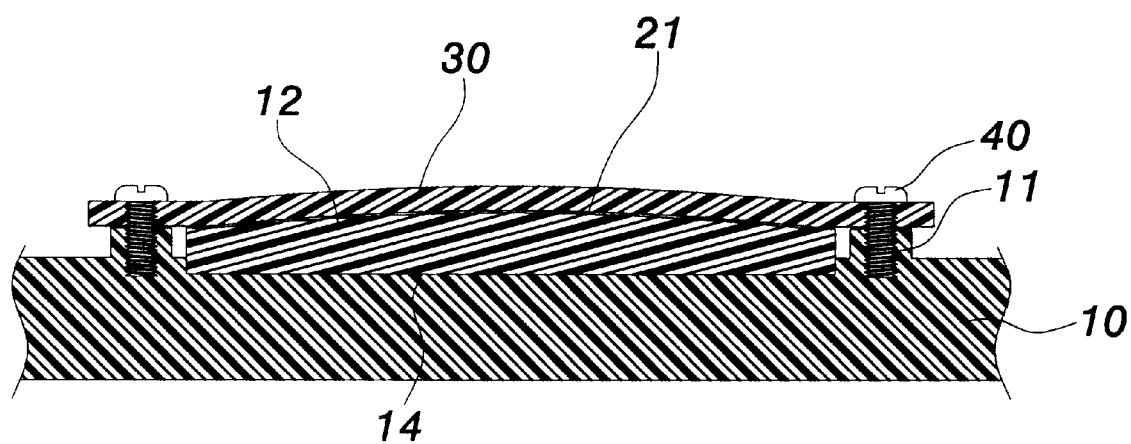
FIG. 12 shows the sectional view of the fourth preferred embodiment of the present invention in assembled state.

As shown in FIGS. 11 and 12, in still another preferred embodiment of the present invention, the arch-shaped bump 12 is arranged on the cover plate 10 by assembling. The cover plate 10 has an assembling groove 14 thereon and the arch-shaped bump 12 is embedded or bound to the assembling groove 14. Moreover, the arch-shaped bump 12 can be made flexible materials such as foam or rubber.

To sum up, the present invention enhances the contact between the printed circuit board and the circuit membrane, while the cost and assembling time is reduced.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A printed circuit board assembly comprising:
    a circuit membranes having an extended ribbon cable with a plurality of longitudinally spaced electric contacts;
    a printed circuit board with a plurality of longitudinally spaced electric contacts corresponding to the electric contacts of the circuit membrane;
    a cover plate having an arch-shaped bump formed thereon and locked in correspondence to the electric contacts of the circuit membrane and the printed circuit board; and
    two screws passing through two longitudinally spaced portions of the printed circuit board and screw to the cover plate for fixing the printed circuit board to the cover plate and clamping the ribbon cable between the cover plate and the printed circuit board; the electric contacts of the printed circuit board being in contact with the electric contacts of the circuit membrane, wherein the arch of said arch-shaped bump extends longitudinally to have an apex intermediate the two screws for providing a substantially uniform contact force between the plurality of electric contacts of the printed circuit board and the electric contacts of the circuit membrane.

2. The printed circuit board assembly as in claim 1, wherein the circuit membrane is placed atop or below the cover plate.

3. The printed circuit board assembly as in claim 1, wherein the ribbon cable is pressed to form a corrugated shape with convex portions and concave portions; the electric contacts being located at the convex portions such that the electric contacts of the circuit membrane are displaced toward the electric contacts of the printed circuit board.

4. The printed circuit board assembly as in claim 1, wherein the printed circuit board is placed atop or below the ribbon cable.

5. The printed circuit board assembly as in claim 1, wherein a plurality of ribs are formed on the arch-shaped bump of the cover plate and located at positions corresponding to that of the electric contacts of the printed circuit board and the electric contacts of the circuit membrane; the electric contacts of the circuit membrane approaching toward the electric contacts of the printed circuit board.

6. The printed circuit board assembly as in claim 1, wherein the cover plate has two threaded holes and the two screws are screwed to the two threaded holes.

7. The printed circuit board assembly as in claim 1, wherein the arch-shaped bump is integrally formed on the cover plate.

8. The printed circuit board assembly as in claim 1, wherein the arch-shaped bump is assembled on the cover plate.

9. The printed circuit board assembly as in claim 8, wherein the cover plate has an assembling groove and the arch-shaped bump is assembled on the assembling groove.

* * * * *